United States Patent
Karpov et al.

(10) Patent No.: US 10,665,781 B2
(45) Date of Patent: *May 26, 2020

(54) PROGRAMMABLE METALLIZATION CELL WITH ALLOY LAYER

(71) Applicant: Intel Corporation, Santa Clara, CA (US)

(72) Inventors: Elijah V. Karpov, Portland, OR (US); Jeffery D. Bielefeld, Forest Grove, OR (US); James S. Clarke, Portland, OR (US); Ravi Pillarisetty, Portland, OR (US); Uday Shah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/077,760

(22) PCT Filed: Mar. 31, 2016

(86) PCT No.: PCT/US2016/025437
§ 371 (c)(1),
(2) Date: Aug. 14, 2018

(87) PCT Pub. No.: WO2017/171821
PCT Pub. Date: Oct. 5, 2017

(65) Prior Publication Data
US 2019/0058115 A1 Feb. 21, 2019

(51) Int. Cl.
*H01L 45/00* (2006.01)

(52) U.S. Cl.
CPC ........ *H01L 45/085* (2013.01); *H01L 45/1233* (2013.01); *H01L 45/1266* (2013.01);
(Continued)

(58) Field of Classification Search
CPC ............... H01L 45/085; H01L 45/1233; H01L 45/1266; H01L 45/142; H01L 45/143;
(Continued)

(56) References Cited

U.S. PATENT DOCUMENTS

| 6,348,365 B1 * | 2/2002 | Moore ................. G11C 13/0011 257/E21.646 |
| 2006/0181920 A1 | 8/2006 | Ufert |

(Continued)

OTHER PUBLICATIONS

The International Searching Authority, Written Opinion of the International Searching Authority and the International Search Report dated Dec. 21, 2016 in International Application No. PCT/US2016/025437, 12 pages.

(Continued)

*Primary Examiner* — Stephen W Smoot
(74) *Attorney, Agent, or Firm* — Trop, Pruner & Hu, P.C.

(57) ABSTRACT

An embodiment includes a programmable metallization cell (PMC) memory comprising: a top electrode and a bottom electrode; a metal layer between the top and bottom electrodes; and a solid electrolyte (SE) layer between the metal layer and the bottom electrode; wherein (a) the metal layer includes an alloy of first and second metals, and (b) metal ions from the first metal form a conductive path in the SE layer when the top electrode is positively biased and disband the conductive path when the top electrode is negatively biased. Other embodiments are described herein.

22 Claims, 6 Drawing Sheets

(52) U.S. Cl.
CPC ...... *H01L 45/1608* (2013.01); *H01L 45/1666* (2013.01); *H01L 45/1675* (2013.01); *H01L 45/142* (2013.01); *H01L 45/143* (2013.01); *H01L 45/146* (2013.01)

(58) Field of Classification Search
CPC ............... H01L 45/146; H01L 45/1608; H01L 45/1666; H01L 45/1675
See application file for complete search history.

(56) References Cited

U.S. PATENT DOCUMENTS

| | | | |
|---|---|---|---|
| 2008/0006810 A1* | 1/2008 | Park | H01L 27/2436 257/4 |
| 2010/0265757 A1* | 10/2010 | Otsuka | G11C 13/0009 365/148 |
| 2011/0001108 A1* | 1/2011 | Greene | H01L 27/2436 257/2 |
| 2011/0007544 A1 | 1/2011 | Vaithyanathan et al. | |
| 2011/0121254 A1* | 5/2011 | Dressler | H01L 45/085 257/4 |
| 2012/0138884 A1 | 6/2012 | Tian et al. | |
| 2012/0250395 A1 | 10/2012 | Nodin | |
| 2013/0286712 A1 | 10/2013 | Liu et al. | |
| 2015/0090947 A1* | 4/2015 | Marsh | H01L 45/085 257/2 |

OTHER PUBLICATIONS

Wang et al., "Non-volatile CBRAM_Crossbar based 3D-Integrated Hybrid memory for Data Retention", IEEE Transactions on Very Large Scale Integration Systems (TVSI), 2013, pp. 957-970, vol. 22, Issue 5, Institute of Electrical and Electronics Engineers.

Wikipedia, "Programmable metallization cell", Feb. 29, 2016, 5 pages, https://en.wikipedia.org/wiki/Programmable_metallization_cell.

Wikipedia, "Noble metal", Feb. 29, 2016, 4 pages, https://en.wikipedia.org/wiki/Noble_metal.

Wikipedia, "Monolayer", Mar. 1, 2016, 3 pages, https://en.wikipedia.org/wiki/Monolayer.

Solid State Technology, "#10: Visualizing CBRAM Filaments", Feb. 29, 2016, http://electroiq.com/blog/2012/12/10-visualizing-cbram-filaments/.

Xu et al., "Investigation of LRS dependence on the retention of HRS in CBRAM", Nanoscale Research Letters, 2015, pp. 1-6, vol. 10, Issue 61, Springer.

* cited by examiner

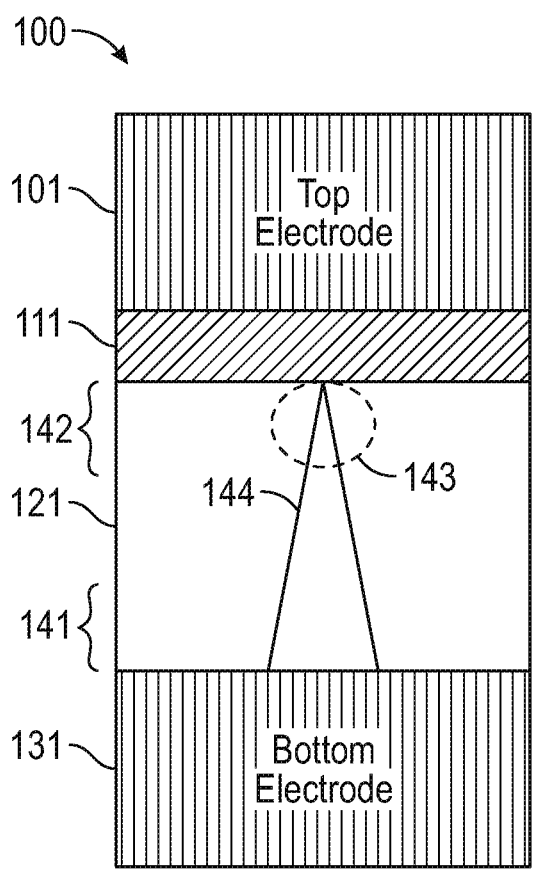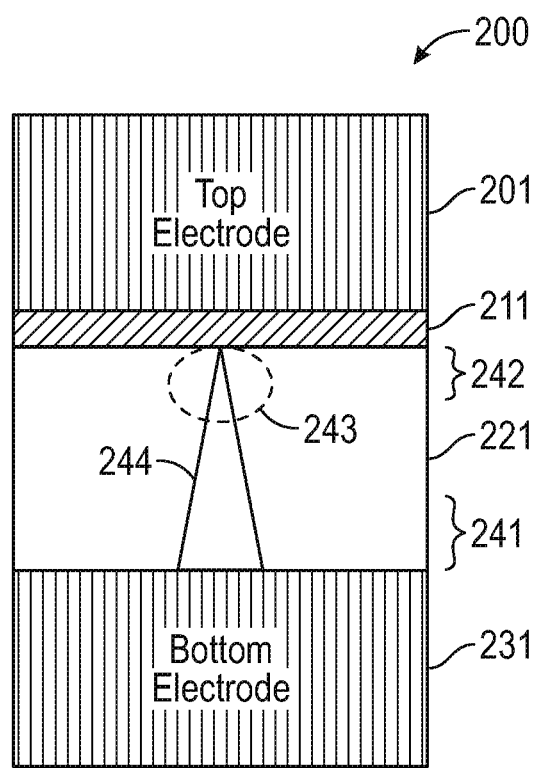
FIG. 1
(Prior Art)
FIG. 2
(Prior Art)

US 10,665,781 B2

PROGRAMMABLE METALLIZATION CELL WITH ALLOY LAYER

TECHNICAL FIELD

Embodiments of the invention are in the field of semiconductor devices and, in particular, non-volatile memory.

BACKGROUND

A programmable metallization cell (PMC), also known as a conductive bridge random access memory (CBRAM), is a two terminal resistive memory technology. The memory relies on reduction/oxidation (redox) reactions to form and dissolve a conductive filament. The state of the device is determined by the resistance across the two terminals. The existence of a filament between the terminals produces a low resistance state (LRS) while the absence of a filament (or presence of an incomplete filament) results in a high resistance state (HRS). More specifically, the memory switches from a low to a high resistive state (by disbanding or disrupting the filament) and from a high to a low resistive state (by reforming the filament) by applying voltages of different polarities to the electrodes to switch the state. Thus, a PMC can serve as a memory.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

FIGS. 1 and 2 include conventional PMCs.

DETAILED DESCRIPTION

Figure 3:
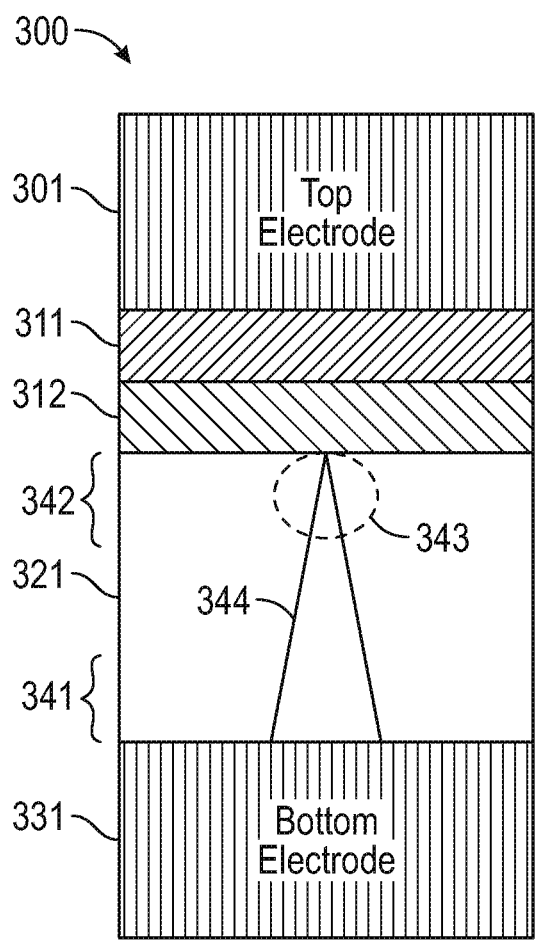
FIG. 3 includes a PMC in an embodiment of the invention.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

FIG. 1 includes a conventional PMC 100 including top electrode 101, barrier layer 111 (e.g., Ta/TiW and the like), solid electrolyte 121 (e.g., silver-doped germanium selenide, silver-doped germanium sulfide, copper-doped germanium sulfide, $Al_2O_3$, $HfO_2$, $SiO_2$, $ZrO_2$, $TiO_2$, $SiO_2$, $WO_3$, and the like), and bottom electrode 131.

More specifically and as generally addressed in "Nonvolatile CBRAM-Crossbar-Based 3-D-Integrated Hybrid Memory for Data Retention.", Wang, Y. et al., IEEE Transactions on Very Large Scale Integration (VLSI) Systems, 22(5), 957-970, (2014), PMC 100 has an active anode layer 101, a solid electrolyte layer 121, and an inert cathode layer 131. PMC 100 includes a conductive metal filament 144 within ambient resistive solid electrolyte 121. When a positive bias-voltage is applied to anode 101 (SET operation, or low resistive state (LRS), or a "1" memory state), the conductive filament 144 grows vertically towards anode 101 by accumulating metal ions 143 until the two electrodes 101, 131 are bridged together. Then the cone begins to morph into a cylinder (only the cone is shown in FIG. 1), which will eventually set the PMC into LRS or on state. More specifically, the positive bias oxidizes the active metal of electrode 101 and the applied bias generates an electric field between the two metal contacts 101, 131. The ionized (oxidized) metal ions 144 migrate along the electric field toward the anode contact. At the cathode contact, the metal ions are reduced. As the active metal (e.g., Cu from electrode 101) deposits on the cathode 131, the electric field increases between the anode and the deposited ions on the cathode. The filament (or sometimes referred to as "path") will grow to connect to the anode within a few nanoseconds. Metal ions will continue to be reduced at the filament until the voltage is removed from the electrodes, broadening the conductive filament and decreasing the resistance of the connection over time. Once the voltage is removed, the conductive filament will remain, leaving the device in a LRS. The conductive filament may not be continuous, but a chain of electrodeposit islands or nanocrystals. This is likely to prevail at low programming currents (less than 1 µA) whereas higher programming current will lead to a mostly metallic conductor.

Similarly when a negative bias-voltage is applied to electrode 101 (RESET operation, or high resistance state (HRS), or a "0" memory state), the cylinder-shaped conductive filament dissolves to a cone (shown in FIG. 1) and disconnects the two electrodes, shrinks vertically, and then turns the PMC into the HRS or off state. Specifically, the redox process used to create the conductive filament is reversed and the metal ions migrate along the reversed electric field to reduce at the anode contact.

Metal ions may have a higher concentration in region 141 and a relatively lower concentration in region 142. The metal ions may form/disband at area 143 (adjacent the anode 101).

Applicant notes conventional systems such as PMC 100 use thin barrier layer 111 between active electrode 101 and dielectric 121 (i.e., solid electrolyte). However, Applicant has determined barrier layer properties are not always well understood and can lead to inconsistency in the manufacture of PMCs.

FIG. 2 is similar to FIG. 1. Conventional PMC 200 includes anode 201, cathode 231, solid electrolyte 221, and metal ions at varying concentrations in areas 241, 242. Filament 244 forms/disbands at area 243 in response to positive and negative biasing of anode 201. However, instead of barrier layer 111 (FIG. 1) PMC 200 includes a very thin layer 211 of active material, such as copper (Cu), used in both anode 201 and layer 211. By making the layer 211 relatively thin the goal is to minimize the amount of Cu adjacent to the dielectric 221 in hopes of lessening the migration of Cu into the dielectric. However, Applicant has determined forming such a thin layer (e.g., 1-3 monolayers thick) is difficult to do consistently and faces challenges for mass production.

Applicant addresses the shortcomings of PMCs 100, 200 addressed above by providing embodiments that addresses how to deposit an active electrode layer (which has a highly controlled small amount of material that forms a metallic filament) in the PMC. Such embodiments may include an active electrode (e.g., layer 312 of FIG. 3) that includes both: (a) a material that will form a metallic filament (e.g., Cu, Ag, Ni), and (b) a noble metal such as, for example, Ru, Rh, Pd, Ir, Pt, and Au. Such embodiments may include an active electrode that includes both: (a) a material that will form a metallic filament (e.g., Cu, Ag, Ni), and (b) a metal such as, for example, Zn, Co, Al, Li, Ti, V, Cr, Zr, Nb, Ta, and W. Such embodiments may include an active electrode that includes both: (a) a material that will form a metallic filament (e.g., Cu, Ag, Ni), and (b) an inert metal such as, for example, Pd or Pt. Such active electrodes may be located between top and bottom electrodes. In some embodiments the active electrode is located between a solid electrolyte layer and the top electrode. In some embodiments the active electrode is located between a solid electrolyte layer and a barrier layer, where the barrier layer is between the active electrode and a top electrode.

For example, an embodiment includes an active electrode (sometimes referred to as a metal layer) comprising an alloy of Cu and one or more members selected from the group comprising: Pd, Ir, and Pt. Another embodiment includes an active electrode comprising an alloy of Cu and one or more members selected from the group including Zn, Ti, Al, W, Si, and Ni.

Noble metals are metals that are resistant to corrosion and oxidation in moist air (unlike most base metals). Noble metals include, for example, ruthenium, rhodium, palladium, iridium, platinum, and gold.

The anode (also called the active electrode) may include an alloy or an intermetallic compound including the filament material (Cu, Ag, Ni) and the noble or inert metal.

An alloy is a mixture of metals or a mixture of a metal and another element. Alloys are defined by their metallic bonding character. An alloy may be a solid solution of metal elements (a single phase) or a mixture of metallic phases (two or more solutions). Intermetallic compounds are alloys with a defined stoichiometry and crystal structure. Specifically, an intermetallic compound is any solid material, composed of two or more metal atoms in a definite proportion, which has a definite structure which differs from those of its constituent metals. For instance, an alloy is a solution of two or more components but there is no order in bonding between the components and the composition of the alloy can vary without much impact on the properties (e.g., strength, electrical resistance) of the alloy. However, an intermetallic compound is more ordered, with a defined stoichiometry and bond structure. As used herein, an intermetallic compound is a type of alloy.

Thus, several embodiments include a small amount of the active metallic element (e.g., Cu) in the alloy active electrode layer. Thus, having such a small amount (e.g., <5% Cu in a layer of Pd) would likely lead to an alloy (as opposed to an intermetallic compound) without consistent distribution of the Cu within the Pd layer.

FIG. 3 includes a PMC 300 in an embodiment. PMC 300 includes top electrode 301, barrier layer 311 (e.g., Ta/TiW and the like), metal layer 312 (anode), solid electrolyte 321 (e.g., silver-doped germanium selenide, silver-doped germanium sulfide, copper-doped germanium sulfide, $Al_2O_3$, $HfO_2$, $SiO_2$, $ZrO_2$, $TiO_2$, and the like), and bottom electrode 331 (cathode). Metal layer 312 may include an alloy or intermetallic compound including: (a) at least one of Cu, Ni, and Ag, and (b) at least one of Pd, Ir, Ag, Pt, Zn, Si, Ni, W, Co, and Al.

PMC 300 functions similarly (in terms of SET and RESET operations) to PMCs 100 and 200. However, PMC 300 has distinct advantages over PMCs 100 and 200. For example, PMC 300 has a metal layer 312 that is much larger than the thin (e.g., 3 monolayers thick, which is less than 1 nm) layer 211. Where layer 211 may be less than 1 nm thick, layer 312 may be 10 nm thick or more yet still contain the same number of Cu atoms as found in layer 211. As a result, layer 312 may still supply Cu metal ions to facilitate metal ion supply (and filament or path construction) but without supplying Cu directly adjacent to dielectric 321. In other words, with a layer as thin as layer 211, any Cu in layer 211 will necessarily be adjacent dielectric 221. As a result, the Cu is likely to migrate into dielectric 221. Furthermore, there is inherent complexity in depositing a very thin layer (only a few monolayers thick) of Cu. As used herein, a "monolayer" is a single, closely packed layer of atoms. But with PMC 300 the same amount of Cu (i.e., number of Cu atoms) found in layer 211 can instead be placed in layer 312, which may be 8, 9, 10, 11, 12, 13, 14, 15 nm or more in thickness (where thickness is measured vertically in FIG. 3). And since layer 312 is thicker (relative to layer 211), the same amount of Cu that is tightly located within layer 211 can instead be dispersed within layer 312. Since the Cu is not all directly adjacent dielectric 321, migration of Cu into dielectric 321 is lessened (but there is still the same amount of Cu atoms available to form the conductive filament/path of the PMC). The amount of Cu within layer 312 may vary and include 5%, 10%, 20%, 30%, 40%, 50%, 60%, 70% or more of layer 312 (with the remaining portion including Pd and/or Ti for instance). Not only can the percent of Cu within layer 312 be varied, the percent of Cu along the interface with dielectric layer 321 may be varied. The % of Cu along the interface of layers 312/321 may be the same or different from the % of Cu within layer 312.

Some embodiments (but not all) include barrier layer 311 to reduce any migration of Cu into top electrode 301 (which is different from barrier layers in conventional systems designed to prevent migration of materials into the dielectric). Electrodes 301 and 331 may each be 100 nm thick or more. Inert electrode 331 may include W or Ni, electrochemically active electrode 312 may include Ag or Cu, and top electrode 301 may include Pd or other noble metals such as, for example, Ru, Rh, Ir, Pt, and Au. Electrodes 301, 331 may include multiple layers of materials with differing properties. Electrodes 301, 311 may include Cu, W or Al as part of typical interconnect metallization layers used in many integrated circuits. Electrodes 301, 311 may also include Ta, TiN, TaN as part of a hardmask used to pattern and etch the device layers. Electrode 331 may include an inert material such as Ir, Pd, Pt, W or other inert metal layers which are compatible with solid electrolyte 321 and do not react with solid electrolyte 321 to form an undesirable interfacial layer. In an embodiment layer 312 directly contacts dielectric 321.

Embodiments such as PMC 300 can be used in embedded non-volatile memory that can be scaled to small dimensions and avoid having to form thin (e.g., less 1 nm thick) metal layers such as layer 211.

Figure 4:
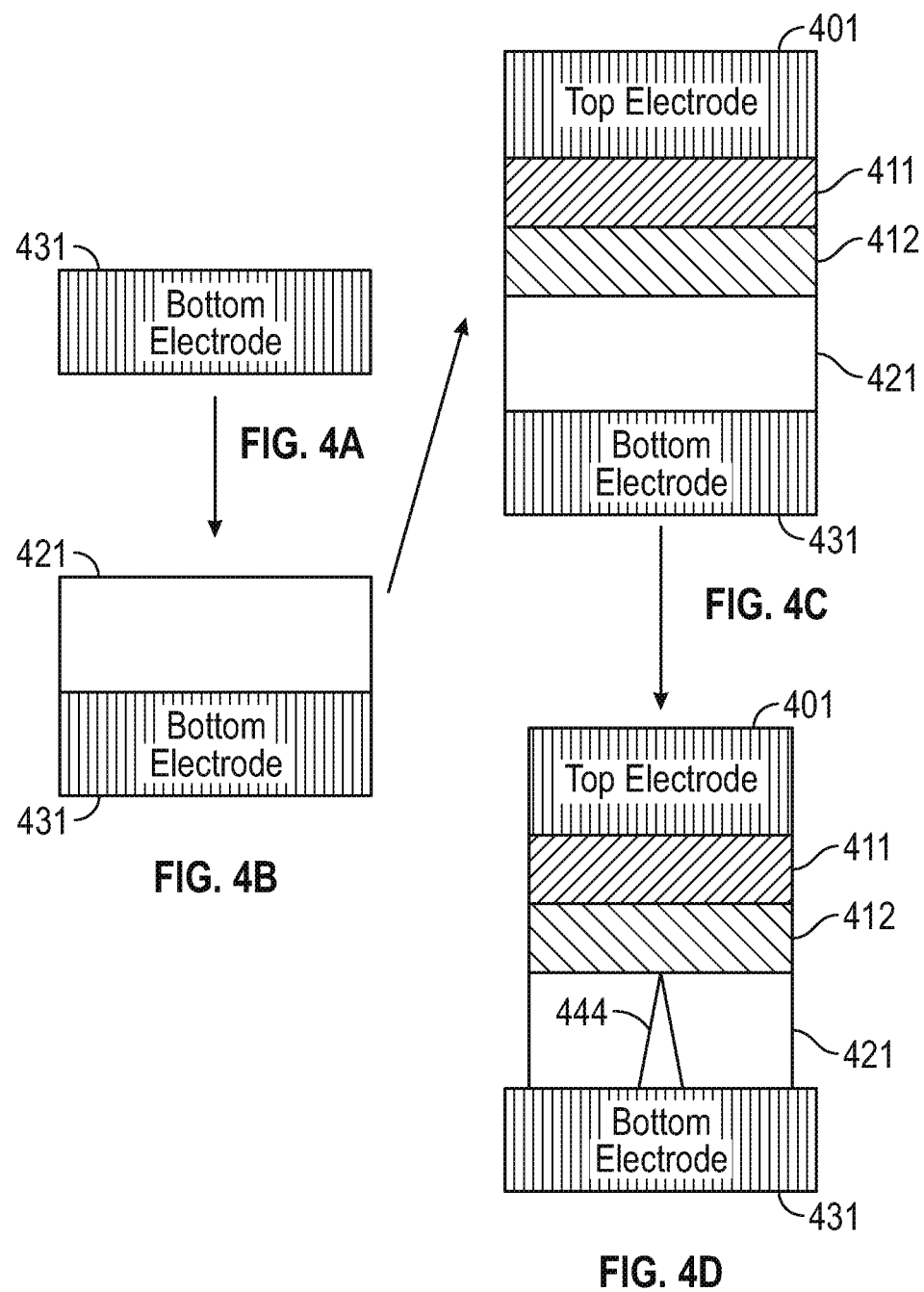
FIGS. 4A-4D include a method of forming a PMC in an embodiment of the invention.

FIGS. 4A-4D depict a method of forming a PMC stack in an embodiment of the invention. In FIG. 4A the bottom electrode 431 is formed. In FIG. 4B solid electrolyte 421 is formed. In FIG. 4C metal layer 412 (e.g., alloy of Cu and Pd), barrier layer 411, and top electrode 401 are formed. Finally, in FIG. 4D (shown in LRS) patterning and etching occur to form the PMC cell where a filament 444 may be formed when electrode 401 is positively biased.

Various embodiments disclosed herein have addressed PMC stacks. Any such stack may be used in a memory cell by coupling one portion or node of the stack (e.g., top electrode of FIG. 3) to a bit-line and another node of the stack (e.g., bottom electrode of FIG. 3) to a source or drain node of a switching device, such as a selection transistor. The other of the source and drain node of the selection transistor may be coupled to a source line of the memory cell. The gate of the selection transistor may couple to a word-line. Such a memory cell may utilize resistance to store memory states. Embodiments provide smaller and more power efficient memory cells that can be scaled below, for example, 22 nm CD. The PMC stack may couple to a sense amplifier. A plurality of the PMC memory cells may be operably connected to one another to form a memory array, wherein the memory array can be incorporated into a non-volatile memory device. It is to be understood that the selection transistor may be connected to the top electrode or the bottom electrode of a PMC stack.

Figure 5:
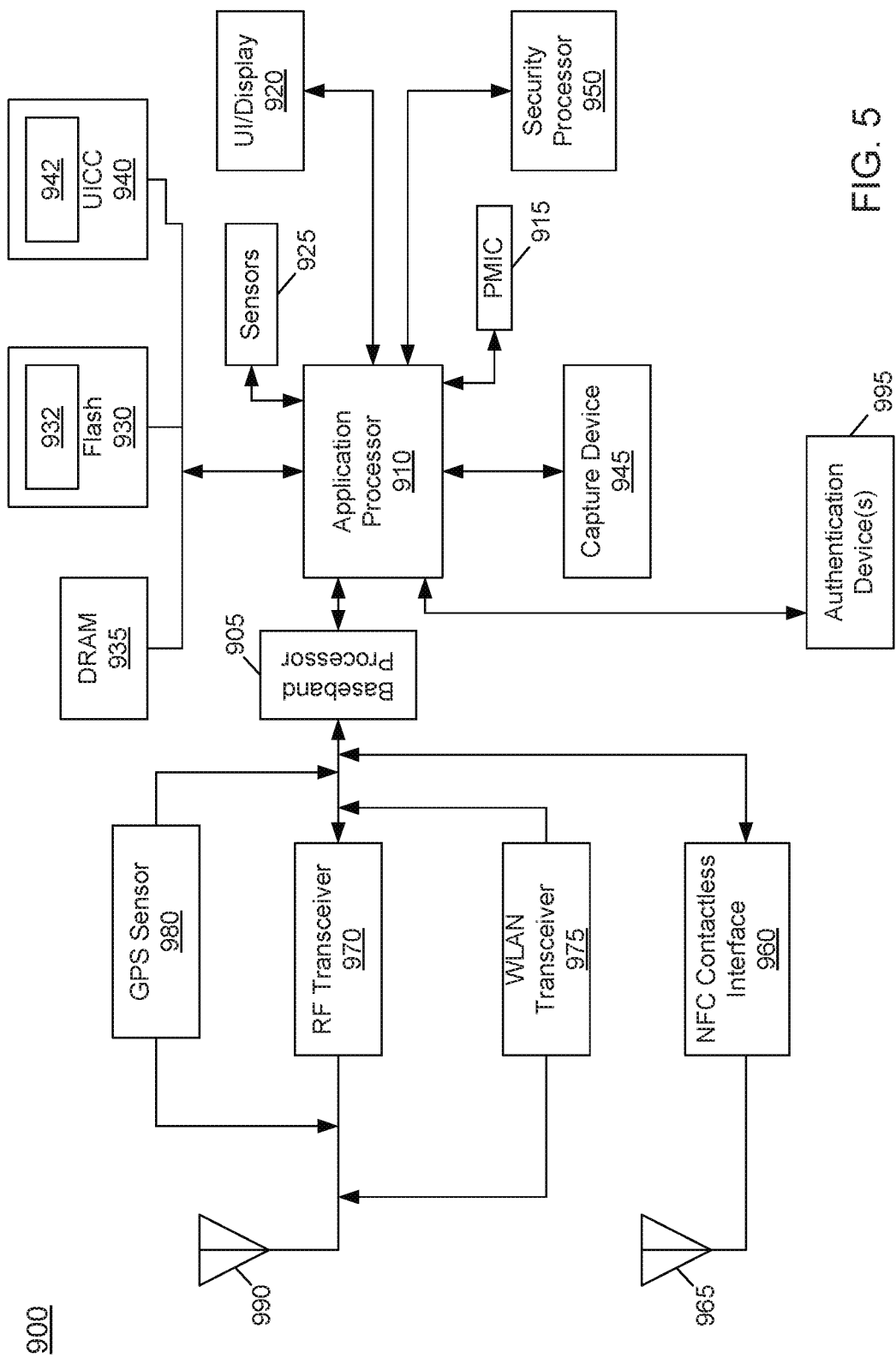
FIGS. 5, 6, and 7 include systems that utilize embodiments of a PMC.
Figure 6:
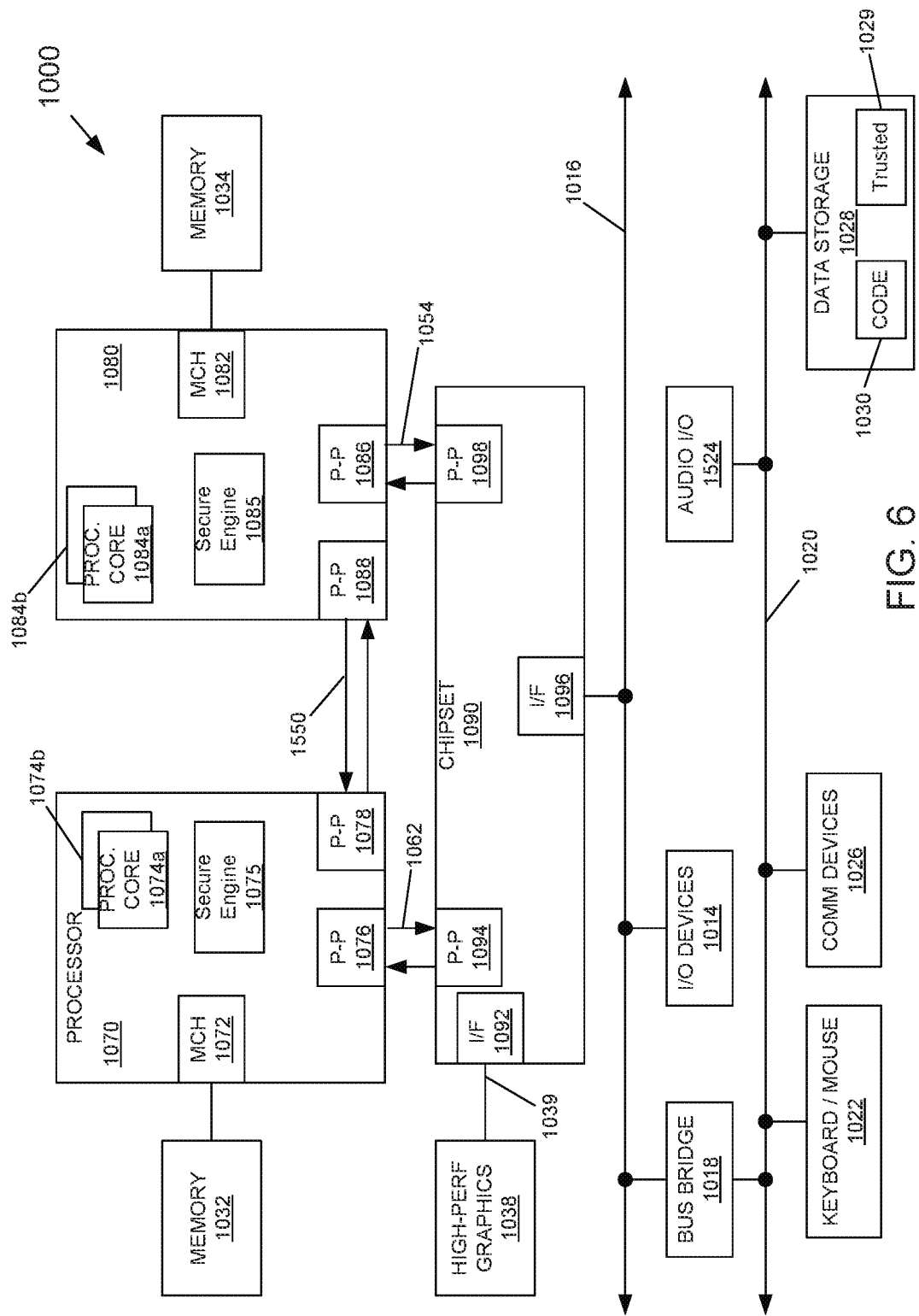
Figure 7:
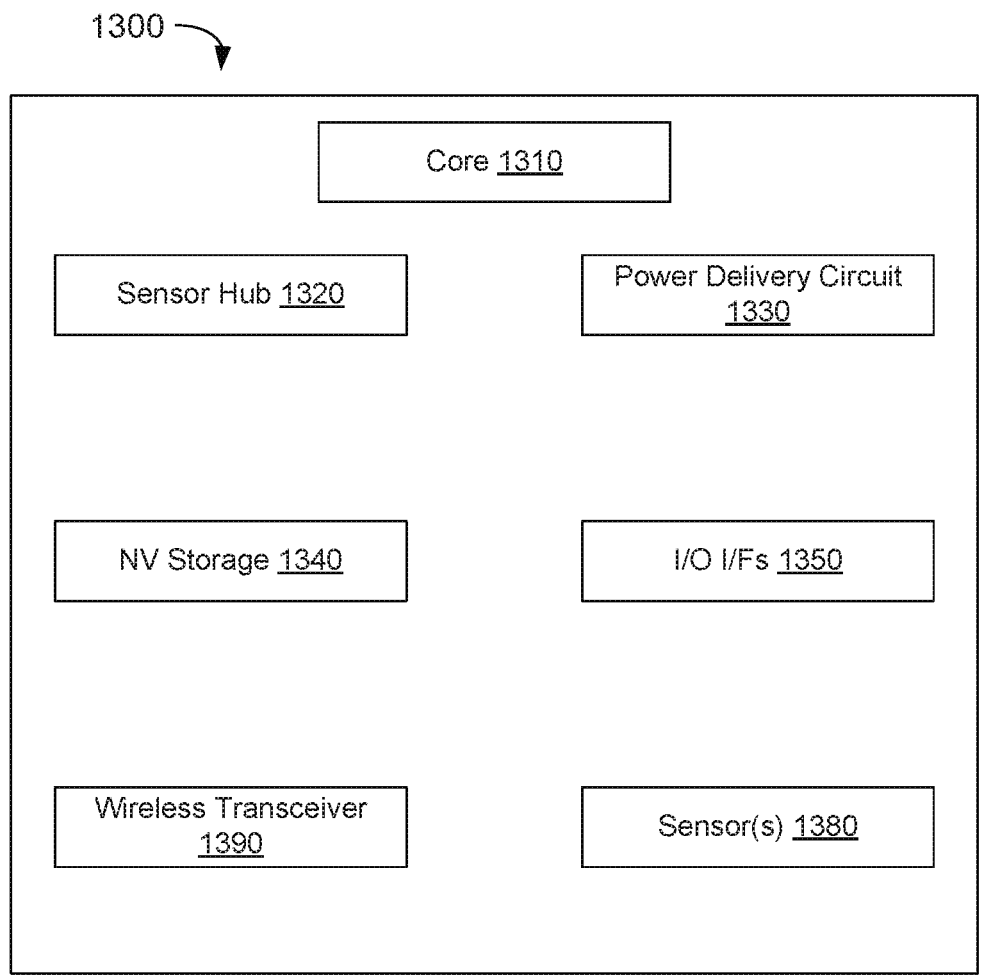

FIGS. 5, 6, 7 each include a system that may include any of the above described embodiments. FIGS. 5, 6, and 7 include block diagrams of systems 900, 1000, 1300 in accordance with embodiments. Each of those systems may include hundreds or thousands of the above described memory cells/stacks (stack 300 of FIG. 3) and be critical to memory functions in those systems. The memory cells may be included in, for example, elements 910, 930, 1070, 1032, 1090, 1310, 1340, 1380, and the like. Systems 900, 1000, 1300 may be included in, for example, a mobile computing node such as a cellular phone, smartphone, tablet, Ultrabook®, notebook, laptop, personal digital assistant, and mobile processor based platform. The stability and power efficiency of such memory cells accumulates when the memory cells are deployed in mass and provides significant performance advantages (e.g., longer memory state storage in a broader range of operating temperatures, less power to operate, faster state switching) to such computing nodes.

Referring now to FIG. 5, shown is a block diagram of an example system with which embodiments can be used. As seen, system 900 may be a smartphone or other wireless communicator or any other IoT device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920, e.g., a touch screen display. In addition, application processor 910 may couple to a memory system including a non-volatile memory, namely a flash memory 930 and a system memory, namely a DRAM 935. In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, e.g., user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals, e.g., AM/FM and other signals may also be provided. In addition, via WLAN transceiver 975, local wireless communications, such as according to a Bluetooth™ or IEEE 802.11 standard can also be realized.

Referring now to FIG. 6, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as key management, attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 via P-P interconnects 1052 and 1054, respectively. As shown in FIG. 6, chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Embodiments may be used in environments where Internet of Things (IoT) devices may include wearable devices or other small form factor IoT devices. Referring now to FIG. 7, shown is a block diagram of a wearable module 1300 in accordance with another embodiment. In one particular implementation, module 1300 may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a TEE as described herein. Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340. In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes a programmable metallization cell (PMC) memory comprising: a top electrode and a bottom electrode; a metal layer between the top and bottom electrodes; and a solid electrolyte (SE) layer between the metal layer and the bottom electrode; wherein (a) the metal layer includes an alloy of first and second metals, and (b) metal ions from the first metal form a conductive path in the SE layer when the top electrode is positively biased and disband the conductive path when the top electrode is negatively biased.

Another version of claim 1 includes a programmable metallization cell (PMC) memory comprising: a top electrode and a bottom electrode; a metal layer between the top and bottom electrodes; and a solid electrolyte (SE) layer between the metal layer and the bottom electrode; wherein the metal layer includes an alloy of first and second metals.

"Top" and "bottom" are relative terms and may change based on the orientation of the stack. OEL is a term of art known to those of ordinary skill in the art.

In example 2 the subject matter of the Example 1 can optionally include a barrier layer between the metal layer and the top electrode.

In example 3 the subject matter of the Examples 1-2 can optionally include wherein the metal layer directly contacts the SE layer.

In example 4 the subject matter of the Examples 1-3 can optionally include wherein the first metal is selected from the group comprising copper, silver, and nickel and the second metal is selected from the group comprising Palladium, Platinum, Tungsten, Cobalt, Molybdenum, and Aluminum.

In another version of example 4 the subject matter of the Examples 1-3 can optionally include wherein the first metal is selected from the group comprising copper, silver, and nickel and the second metal is selected from the group comprising Palladium, Platinum, Tungsten, Cobalt, and Aluminum.

In another version of example 4 the subject matter of the Examples 1-3 can optionally include wherein metal ions from the first metal form a conductive path in the SE layer when the top electrode is positively biased and disband the conductive path when the top electrode is negatively biased.

Example 5 includes a memory comprising: a top electrode and a bottom electrode; a metal layer between the top and bottom electrodes; and a solid electrolyte (SE) layer between the top metal layer and the bottom electrode; wherein (a) the metal layer includes at least one metal and at least one member selected from the group comprising copper, silver, and nickel, and (b) metal ions from the metal layer form a conductive path in the SE layer when the top electrode is biased with a first polarity and disband the conductive path when the top electrode is biased with a second polarity that is opposite the first polarity.

Another version of example 5 includes a memory comprising: a top electrode and a bottom electrode; a metal layer between the top and bottom electrodes; and a solid electrolyte (SE) layer between the metal layer and the bottom electrode; wherein the metal layer includes at least one metal and at least one member selected from the group comprising copper, silver, and nickel.

In example 6 the subject matter of the Example 5 can optionally include a barrier layer between the metal layer and the top electrode.

In example 7 the subject matter of the Examples 5-6 can optionally include wherein the metal layer directly contacts the SE layer.

In example 8 the subject matter of the Examples 5-7 can optionally include wherein the metal layer includes an alloy comprising the at least one metal and the at least one member from the group comprising copper, silver, and nickel.

In example 9 the subject matter of the Examples 5-8 can optionally include wherein the alloy comprises less than 50% of the at least one member from the group comprising copper, silver, and nickel.

In example 10 the subject matter of the Examples 5-9 can optionally include wherein at least ⅓ of the at least one member from the group comprising copper, silver, and nickel is included in an upper third of the metal layer, the upper third of the metal layer being adjacent the barrier layer.

In another version of example 10 the subject matter of the Examples 5-9 can optionally include wherein: at least ⅓ of the at least one member from the group comprising copper, silver, and nickel is included in an upper third of the metal layer, the upper third of the metal layer being adjacent the barrier layer; and the barrier layer includes at least one of Ta, Ti, and W.

In example 11 the subject matter of the Examples 5-10 can optionally include wherein the metal layer is at least 5 nm thick.

In another version of example 11 the subject matter of the Examples 5-10 can optionally include wherein the metal layer is at least 3 nm thick.

In example 12 the subject matter of the Examples 5-11 can optionally include wherein a bottom ⅕$^{th}$ of the metal layer includes a first percentage of the at least one member from the group comprising copper, silver, and nickel, and at least one of 1/10$^{th}$, ⅖$^{th}$, ⅗$^{th}$, ⅘$^{th}$, and upper ⅕$^{th}$ of the metal layer includes a first percentage of the at least one member from the group comprising copper, silver, and nickel that is greater than the first percentage.

In another version of example 12 the subject matter of the Examples 5-11 can optionally include wherein a bottom ⅕$^{th}$ of the metal layer includes a first percentage of the at least one member from the group comprising copper, silver, and nickel, and at least one of an upper 1/10$^{th}$, upper ⅖$^{th}$, upper ⅗$^{th}$, upper ⅘$^{th}$, and upper ⅕$^{th}$ of the metal layer includes a second percentage of the at least one member from the group comprising copper, silver, and nickel that is greater than the first percentage.

In example 13 the subject matter of the Examples 5-12 can optionally include wherein wherein the at least one metal includes at least one additional member selected from the group comprising Palladium, Platinum, Tungsten, Cobalt, Molybdenum, and Aluminum.

In another version of example 13 the subject matter of the Examples 5-12 can optionally include wherein the at least one metal includes at least one additional member selected from the group comprising Palladium, Platinum, Tungsten, Cobalt, and Aluminum.

In example 14 the subject matter of the Examples 5-13 can optionally include wherein the memory is a programmable metallization cell (PMC).

In example 15 the subject matter of the Examples 5-14 can optionally include wherein the lower electrode is a cathode and the metal layer is an anode when the top electrode is biased positively.

In example 16 the subject matter of the Examples 5-15 can optionally include wherein the metal ions are oxidized ions of the at least one member selected from the group comprising copper, silver, and nickel.

In example 17 the subject matter of the Examples 5-16 can optionally include wherein the SE layer includes at least one member selected from the group comprising: $SiO_2$, $WO_3$, $Ta_2O_5$, $ZrO_2$, and non-stoichiometric oxides AOx, where A is a metal.

In another version of example 17 the subject matter of the Examples 5-16 can optionally include wherein the SE layer includes at least one member selected from the group comprising silver-doped germanium selenide, silver-doped germanium sulfide, copper-doped germanium sulfide, $Al_2O_3$, $HfO_2$, $SiO_2$, $ZrO_2$, and $TiO_2$.

In example 18 the subject matter of Examples 5-17 can optionally include wherein the bottom electrode includes at least one member selected from the group comprising TiN, TaN, W, Ru, Ir, TiAlN, and TaAlN and the top electrode includes at least one member selected from the group comprising W, Pd, Pt, Ru, Mo, and TiN.

In another version of example 18 the subject matter of Examples 5-17 can optionally include wherein the bottom electrode includes at least one member selected from the group comprising TiN, TaN, W, Ru, and the top electrode includes at least one member selected from the group comprising W, Cu, and Al.

In example 19 the subject matter of Examples 5-18 can optionally include a system comprising: a processor; a memory, coupled to the processor, according to any one of examples 1 to 18; and a communication module, coupled to the processor, to communicate with a computing node external to the system.

In another version of example 19 the subject matter of Examples 5-18 can optionally include wherein metal ions from the metal layer form a conductive path in the SE layer when the top electrode is biased with a first polarity and disband the conductive path when the top electrode is biased with a second polarity that is opposite the first polarity.

Example 20 includes a method comprising: forming a bottom electrode; forming a solid electrolyte (SE) layer on the bottom electrode; forming a metal layer directly contact an upper surface of the SE layer; forming a barrier layer on the metal layer; forming a top electrode on the barrier layer; patterning the SE layer, the metal layer, and the barrier layer to form a programmable metallization cell (PMC) memory; wherein (a) the metal layer includes an alloy of first and second metals, and (b) metal ions from the first metal form a conductive path in the SE layer when the top electrode is positively biased and disband the conductive path when the top electrode is negatively biased.

Another version of example 20 includes a method comprising: forming a bottom electrode; forming a solid electrolyte (SE) layer on the bottom electrode; forming a metal layer directly contacting an upper surface of the SE layer; forming a barrier layer on the metal layer; forming a top electrode on the barrier layer; and patterning the SE layer, the metal layer, and the barrier layer to form a programmable metallization cell (PMC) memory; wherein the metal layer includes an alloy of first and second metals.

In example 21 the subject matter of the Example 20 can optionally include controlling the percentage of the first metal in the alloy to be less than 50% of the alloy and controlling the thickness of the metal layer to be at least 5 nm.

In example 22 the subject matter of the Examples 20-21 can optionally include wherein the first metal is selected from the group comprising copper, silver, and nickel and the second metal is selected from the group comprising Palladium, Platinum, Tungsten, Cobalt, Molybdenum, and Aluminum.

In another version of example 22 the subject matter of the Examples 20-21 can optionally include wherein the first metal is selected from the group comprising copper, silver, and nickel and the second metal is selected from the group comprising Palladium, Platinum, Tungsten, Cobalt, and Aluminum.

In example 23 the subject matter of the Examples 20-22 can optionally include wherein metal ions from the first metal form a conductive path in the SE layer when the top electrode is positively biased and disband the conductive path when the top electrode is negatively biased.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A programmable metallization cell (PMC) memory comprising:
a top electrode and a bottom electrode;
a metal layer between the top and bottom electrodes; and
a solid electrolyte (SE) layer between the metal layer and the bottom electrode;
wherein the metal layer includes an alloy of at least first and second metals;
wherein the first metal includes at least one of copper, silver, nickel, or combinations thereof, and the second metal includes at least one of palladium, platinum, tungsten, cobalt, or combinations thereof.

2. The memory of claim 1 comprising a barrier layer between the metal layer and the top electrode.

3. The memory of claim 2, wherein the metal layer directly contacts the SE layer.

4. The memory of claim 3, wherein metal ions from the first metal form a conductive path in the SE layer when the top electrode is positively biased and disband the conductive path when the top electrode is negatively biased.

5. A system comprising:
a processor;
a memory, coupled to the processor, according to claim 1; and
a communication module, coupled to the processor, to communicate with a computing node external to the system.

6. A memory comprising:
a top electrode and a bottom electrode;
a metal layer between the top and bottom electrodes; and
a solid electrolyte (SE) layer between the metal layer and the bottom electrode;
wherein the metal layer includes an alloy of at least one metal and at least one of copper, silver, nickel, or combinations thereof;
wherein the metal layer comprises less than 50% of the at least one of copper, silver, nickel, or combinations thereof.

7. The memory of claim 6 comprising a barrier layer between the metal layer and the top electrode.

8. The memory of claim 7, wherein the metal layer directly contacts the SE layer.

9. The memory of claim 7, wherein:
at least ⅓ of the at least one of copper, silver, nickel, or combinations thereof is included in an upper third of the metal layer, the upper third of the metal layer being adjacent the barrier layer; and
the barrier layer includes at least one of Ta, Ti, W, or combinations thereof.

10. The memory of claim 6, wherein the metal layer is at least 3 nm thick.

11. The memory of claim 6, wherein:
a bottom ⅕$^{th}$ of the metal layer includes a first percentage of the at least one of copper, silver, nickel, or combinations thereof;
at least one of an upper ¹/₁₀$^{th}$, upper ⅖$^{th}$, upper ⅗$^{th}$, upper ⅘$^{th}$, or upper ⅕$^{th}$ of the metal layer includes a second percentage of the at least one of copper, silver, nickel, or combinations thereof;
the second percentage is greater than the first percentage.

12. The memory of claim 11, wherein the at least one metal includes at least one of Palladium, Platinum, Tungsten, Cobalt, Aluminum, or combinations thereof.

13. The memory of claim 11, wherein the memory is a programmable metallization cell (PMC).

14. The memory of claim 13, wherein the lower electrode is a cathode and the metal layer is an anode when the top electrode is biased positively.

15. The memory of claim 6, wherein metal ions from the metal layer form a conductive path in the SE layer when the top electrode is biased with a first polarity and disband the conductive path when the top electrode is biased with a second polarity that is opposite the first polarity.

16. The memory of claim 15, wherein the metal ions are oxidized ions of the at least one of copper, silver, nickel, or combinations thereof.

17. The memory of claim 6, wherein the SE layer includes at least one of silver-doped germanium selenide, silver-doped germanium sulfide, copper-doped germanium sulfide, $Al_2O_3$, $HfO_2$, $SiO_2$, $ZrO_2$, $TiO_2$, or combinations thereof.

18. The memory of claim 17, wherein the bottom electrode includes at least one TiN, TaN, W, Ru, or combinations thereof and the top electrode includes at least one of W, Cu, Al, or combinations thereof.

19. A method comprising:
forming a bottom electrode;

forming a solid electrolyte (SE) layer on the bottom electrode;

forming a metal layer directly contacting an upper surface of the SE layer, the metal layer including an alloy of at least first and second metals;

forming a barrier layer on the metal layer;

forming a top electrode on the barrier layer;

patterning the SE layer, the metal layer, and the barrier layer to form a programmable metallization cell (PMC) memory; and controlling a percentage of the first metal in the alloy to be less than 50% of the alloy.

20. The method of claim 19, wherein the first metal includes at least one of copper, silver, nickel, or combinations thereof and the second metal includes at least one of palladium, platinum, tungsten, cobalt, aluminum, or combinations thereof.

21. The method of claim 20 comprising controlling a thickness of the metal layer to be at least 5 nm.

22. The method of claim 19, wherein metal ions from the first metal form a conductive path in the SE layer when the top electrode is positively biased and disband the conductive path when the top electrode is negatively biased.

* * * * *